(12) United States Patent
Tyrrell et al.

(10) Patent No.: US 8,778,087 B2
(45) Date of Patent: Jul. 15, 2014

(54) CONICAL SPONGE BRUSH FOR CLEANING SEMICONDUCTOR WAFERS

(71) Applicant: Illinois Tool Works Inc., Glenview, IL (US)

(72) Inventors: Jeffrey J. Tyrrell, West Berlin, NJ (US); Bradley S. Withers, El Dorado Hills, CA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 13/803,211

(22) Filed: Mar. 14, 2013

(65) Prior Publication Data

US 2013/0255720 A1     Oct. 3, 2013

Related U.S. Application Data

(60) Provisional application No. 61/619,512, filed on Apr. 3, 2012.

(51) Int. Cl.
   *B08B 7/00* (2006.01)

(52) U.S. Cl.
   USPC ........... 134/6; 134/25.5; 134/32; 134/33; 134/42; 15/77; 15/88.2; 15/88.3; 15/102; 15/179; 15/230; 15/230.16; 451/41; 451/54; 451/59

(58) Field of Classification Search
   CPC ............ B08B 1/00; B08B 1/002; B08B 1/02; B08B 1/04; B24B 7/22; B24B 2/228; B24B 29/00; B24B 29/005; H01L 21/00
   USPC ............... 15/77, 88.2, 88.3, 102, 179, 230, 15/230.16; 451/41, 54, 59; 134/6, 25.5, 134/32, 33, 34
   See application file for complete search history.

(56) References Cited

U.S. PATENT DOCUMENTS

| | | | |
|---|---|---|---|
| 4,566,911 A | 1/1986 | Tomita et al. | |
| 5,858,109 A | 1/1999 | Hymes et al. | |
| 6,308,623 B1 | 10/2001 | Schonberger et al. | |
| 6,502,273 B1 | 1/2003 | Mihara et al. | |

(Continued)

FOREIGN PATENT DOCUMENTS

WO     2011103538     8/2011

OTHER PUBLICATIONS

European Patent Office, International Searching Authority, International Search Report and Written Opinion of PCT/US2013/034964 dated Jul. 2, 2013, 13 pages.

(Continued)

*Primary Examiner* — Bibi Carrillo
(74) *Attorney, Agent, or Firm* — Klintworth & Rozenblat IP LLC

(57) ABSTRACT

A cleaning device for cleaning a substrate is provided. In one aspect, the cleaning device includes a brush including a first end, a second end opposed to the first end, an outer surface, and a hollow bore defined in the brush about a central axis of the brush. The brush defines a first cross-sectional area near the first end and a second cross-sectional area near the second end. Both the first and second cross-sectional areas are generally perpendicular to the central axis and the second cross-sectional area is greater than the first cross-sectional area.

13 Claims, 7 Drawing Sheets

(56) References Cited

U.S. PATENT DOCUMENTS

| | | |
|---|---|---|
| 6,598,255 B1 | 7/2003 | Gohda et al. |
| 6,802,099 B2 | 10/2004 | Murakami et al. |
| D622,920 S | 8/2010 | Bejtlich, III |
| 2001/0022008 A1 | 9/2001 | Dickey et al. |
| 2002/0005212 A1 | 1/2002 | Beardsley et al. |
| 2004/0040576 A1 | 3/2004 | Sun et al. |
| 2005/0064712 A1 | 3/2005 | Andreas |
| 2005/0092350 A1 | 5/2005 | Buehler |
| 2006/0096049 A1 | 5/2006 | Sun et al. |
| 2006/0200921 A1 | 9/2006 | Shih et al. |
| 2006/0276108 A1 | 12/2006 | Benson |
| 2007/0181153 A1 | 8/2007 | Kobayashi et al. |
| 2008/0141475 A1 | 6/2008 | Drury |
| 2008/0276394 A1 | 11/2008 | Sato |
| 2010/0212100 A1 | 8/2010 | Ku et al. |
| 2011/0162160 A1 | 7/2011 | Whittaker |
| 2011/0277789 A1 | 11/2011 | Benson |
| 2013/0255721 A1 * | 10/2013 | Tyrrell et al. ............... 134/6 |
| 2013/0283553 A1 * | 10/2013 | Chen et al. ............... 15/159.1 |
| 2013/0283556 A1 * | 10/2013 | Chen et al. ............... 15/168 |

OTHER PUBLICATIONS

European Patent Office, International Searching Authority, International Search Report and Written Opinion of PCT/US2013/034897 dated May 31, 2013, 11 pages.

* cited by examiner

CONICAL SPONGE BRUSH FOR CLEANING SEMICONDUCTOR WAFERS

RELATED APPLICATIONS

The present application claims the benefit of U.S. Provisional Patent Application No. 61/619,512, filed Apr. 3, 2012, the entire contents of which is incorporated herein by reference.

FIELD OF THE INVENTION

The present invention relates generally to processes and devices for cleaning articles. More specifically, it relates to a brush used for cleaning semiconductor substrates.

BACKGROUND

Cast cylindrical polyvinyl alcohol brushes are conventionally used in automatic cleaning systems to provide a post CMP (Chemical Mechanical Planarization) process to effectively clean surfaces of substrates such as semiconductor wafers or other disc-shaped substrates. Cylindrical polyvinyl alcohol brushes are also used in cleaning systems to clean and dry glass and other non-disc-shaped substrates in flat panel display manufacture, glass production, and printed circuit board assembly. Cylindrical brushes may have a length as short as 50 millimeters or as long as 10 meters, for example. The cylindrical brushes extend completely across the substrate being treated, thereby contacting the substrate an entire distance across its diameter.

The cylindrical brushes are located on and driven by a central brush core about a central longitudinal axis in the cleaning process. The cylindrical brushes have a constant cross-sectional diameter when taken perpendicular to the central axis along the length of the brush. An accurate and stable connection between the cylindrical brush and the central brush core is desirable. The cylindrical brushes may have nodules on their outer surface to help clean the substrate.

The cylindrical brushes are expected to accurately rotate on their axis and provide a generally cylindrical surface with a generally consistent nodule pressure pattern. In some cases, the cylindrical brush is formed around the central brush core. For example, the brush core may be placed in a mold and a mixture of chemicals, such as polyvinyl alcohol, is injected into the mold to form the cylindrical brush around the central brush core.

When a rotating cylindrical brush engages a rotating circular substrate, such as a semiconductor wafer, slippage between the cylindrical brush and the circular substrate may occur due to differences between linear speeds of points on the cylindrical brush and the circular substrate. Cylindrical brushes rotate at a generally constant rotational speed, and since the brushes are cylindrically shaped, the linear speed of any point on an outer surface of the cylindrical brush is generally constant. As defined herein, the linear speed of a point on a surface or substrate is the speed of that point in a direction which is tangential to a rotational direction of that point. However, as the circular substrate rotates at a generally constant rotational speed, the linear speed of points near the outer edge of the circular substrate is much greater than the linear speed of points near or at the center of the circular substrate. As a result, it becomes impossible to match the linear speed of all the points on the outer surface of the cylindrical brush with adjacent points engaged on the circular substrate, resulting in some slippage between the cylindrical brush and the circular substrate at an engagement area along which the cylindrical brush engages the circular substrate. This slippage becomes a greater issue for larger sized substrates.

As a result, it would be desirable to have a brush in which the linear speed of all the points on the outer surface of the brush is nearly matched with the linear speed of adjacent points engaged on the circular substrate, resulting in less slippage between the cylindrical brush and the circular substrate at the engagement area along which the cylindrical brush engages the circular substrate.

SUMMARY

In one aspect, a cleaning device for cleaning substrates is provided. The cleaning device includes, but is not limited to, a generally conically-shaped brush having an outer cleaning surface and a hollow bore positioned about a central axis. The conically-shaped brush has a first end opposed to a second end. The first end defines a first cross-sectional area and the second end defines a second cross sectional area. Both the first and second cross-sectional areas are perpendicular to the central axis. The first cross-sectional area is greater than the second cross-sectional area.

In another aspect a method for cleaning substrates is provided. The method includes, but is not limited to, engaging a substrate with a cleaning device having a brush core positioned about a first central axis and a brush having an outer cleaning surface and a hollow bore formed around the brush core. The brush has a first end opposed to a second end. A cross-sectional area of the brush when taken perpendicular to the first central axis of the brush core is generally increasing from the first end to the second end. The method also includes, but is not limited to, rotating the brush about the first central axis in a first rotational direction and the substrate about a second central axis in a second rotational direction. The second central axis is intersects the first central axis. Points formed linearly along the outer cleaning surface from the first end of the brush to the second end of the brush each travel at a first linear velocity which is tangential to the first rotational direction and which is generally increasing from the first end of the brush to the second end of the brush. Points formed radially along the substrate from an outer edge of the substrate to a center of the substrate each travel at a second linear velocity which is tangential to the second rotational direction and which is generally decreasing from the outer edge of the substrate to the center of the substrate.

In a further aspect, a method for cleaning substrates is provided. The method includes, but is not limited to, engaging a substrate with a cleaning device having a brush core and a generally conically-shaped brush formed around the brush core. A first engagement surface on the generally conically-shaped brush engages a second engagement surface on the substrate. A difference between a first linear velocity of any first point on the first engagement surface and a second linear velocity of a second point on the second engagement surface and adjacent the first point is generally constant to within about ±10%.

In still another aspect, a cleaning device for cleaning a substrate is provided and includes a brush including a first end, a second end opposed to the first end, an outer surface, and a hollow bore defined in the brush about a central axis of the brush. The brush defines a first cross-sectional area near the first end and a second cross-sectional area near the second end. Both the first and second cross-sectional areas are generally perpendicular to the central axis and the second cross-sectional area is greater than the first cross-sectional area.

In still a further aspect, a method for cleaning a substrate is provided and includes engaging a substrate with a cleaning device including a brush core positioned about a first axis and a brush including an outer surface and a hollow bore defined in the brush around the brush core. The brush also includes a first end opposed to a second end. A cross-sectional area of the brush when taken generally perpendicular to the first axis increases from the first end to the second end. The method also including rotating the brush about the first axis in a first rotational direction, and rotating the substrate about a second axis in a second rotational direction. The second axis intersects the first axis, and points formed linearly along the outer surface from the first end of the brush to the second end of the brush each travel at a respective first linear velocity. The first linear velocities are tangential to the first rotational direction and are generally increasing from the first end of the brush to the second end of the brush. Points formed radially along the substrate from an outer edge of the substrate to a center of the substrate and each travel at a respective second linear velocity. The second linear velocities are tangential to the second rotational direction and are generally decreasing from the outer edge of the substrate to the center of the substrate.

In yet another aspect, a method for cleaning a substrate is provided and includes rotating a cleaning device about a first axis. The cleaning device includes a first end, a second end opposed to the first end, a brush core positioned about the first axis, and a brush formed around the brush core. A cross-sectional area of the brush when taken generally perpendicular to the first axis generally increases from the first end to the second end. The method also including rotating a substrate about a second axis, and engaging a first surface of the cleaning device with a second surface of the substrate. A difference between a first linear velocity of any point on the first engagement surface and a second linear velocity of a point on the second engagement surface and adjacent the first point is generally constant to within about ±10%.

The scope of the present invention is defined solely by the appended claims and is not affected by the statements within this summary.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

Methods and systems consistent with the present disclosure overcome the disadvantages of conventional brushes and brush-core systems by forming a brush adapted to provide consistent relative velocity between the brush and a substrate. In one exemplary embodiment, a generally conically-shaped, or frusto-conically-shaped, brush is provided and matches or coordinates linear speeds of all the points on the outer surface of the brush with the linear speeds of adjacent points engaged on the substrate, resulting in less slippage between the brush and the circular substrate at the engagement area along which the brush engages the circular substrate.

Figure 1:
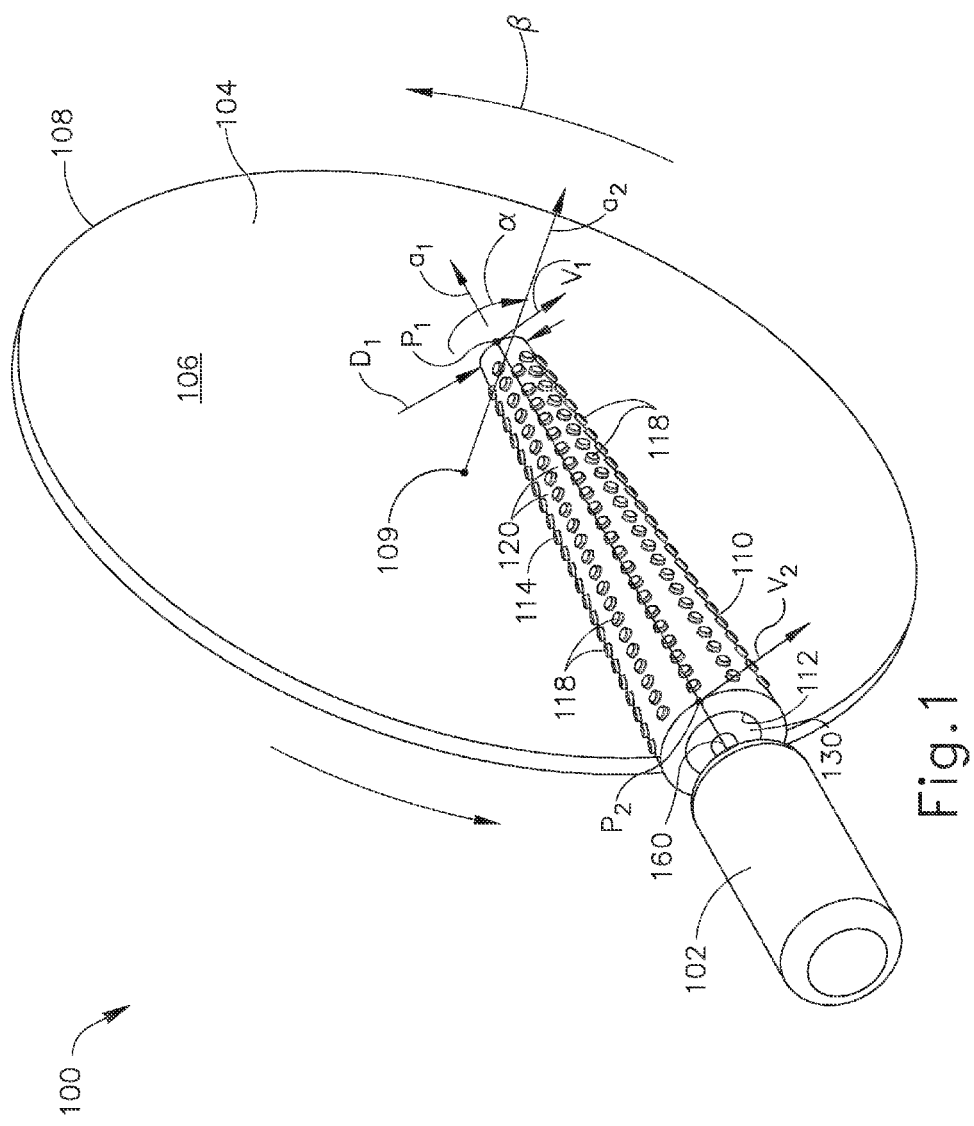
FIG. 1 depicts a perspective view of a cleaning system for cleaning and/or polishing substrates, in accordance with one embodiment of the present invention.

With reference to FIG. 1, there is shown a cleaning system 100 for cleaning and polishing substrates 104. The cleaning system 100 may be an automatic cleaning system which can automatically or manually be set to polish and/or clean a substrate 104, and more particularly a surface 106 of the substrate 104. Substrate 104 includes any one of a variety of disc-shaped or non-disc-shaped substrates, such as: silicon based substrates including glass, dry glass, semiconductor wafers, flat panel display glass panels, glass production panels, and printed circuit boards; polymer-based substrates; and various types of semiconductor substrates such as silicon-based semiconductor substrates, single element semiconductor substrates, silicon on insulator (SOI) substrates, III-V semiconductor substrates, II-VI semiconductor substrates, other binary semiconductor substrates, ternary semiconductor substrates, quaternary semiconductor substrates; fiber optic substrates; superconducting substrates; glass substrates; fused quartz substrates; fused silica substrates; epitaxial silicon substrates; and organic semiconductor substrates.

With reference to FIGS. 1-4, cleaning system 100 includes a generally conically-shaped, or frusto-conically shaped, brush 110 having a hollow bore 112, a brush core 130 engaging the brush 110 within the hollow bore 112, and a rotational device 102 engaging the brush core 130. The illustrated core 130 is only an exemplary core and is not intended to be limiting. The cleaning system 100 may include a variety of other cores and all of such core possibilities are intended to be within the spirit and scope of the present disclosure. The conically-shaped brush 110 may be used in a conventional automatic cleaning system to provide a post chemical mechanical planarization (CMP) process to effectively clean the surface 106 of substrate 104. For example, the brush 110 may be a cast polyvinyl alcohol (PVA) foam brush, a polyurethane foam brush, other polymeric foam brush, or other absorbent material adapted to satisfactorily clean and/or polish a substrate 104.

A generally conically-shaped member, or a generally frusto-conically shaped member, such as the brush 110, may be a member formed around a longitudinal central axis $a_1$, and may be balanced around the central axis $a_1$ in such a way that the centrifugal forces generated by the member as the member rotates around the central axis $a_1$ vary by no more than about ±20%, providing for a relatively balanced member, and for which one end 126 has a greater cross sectional area, when taken perpendicular to the central axis $a_1$, than another end 124. The generally conically-shaped member, or a generally frusto-conically shaped member, may include interruptions, such as nodules or cavities, formed on or in its outer surface 114.

Figure 2:
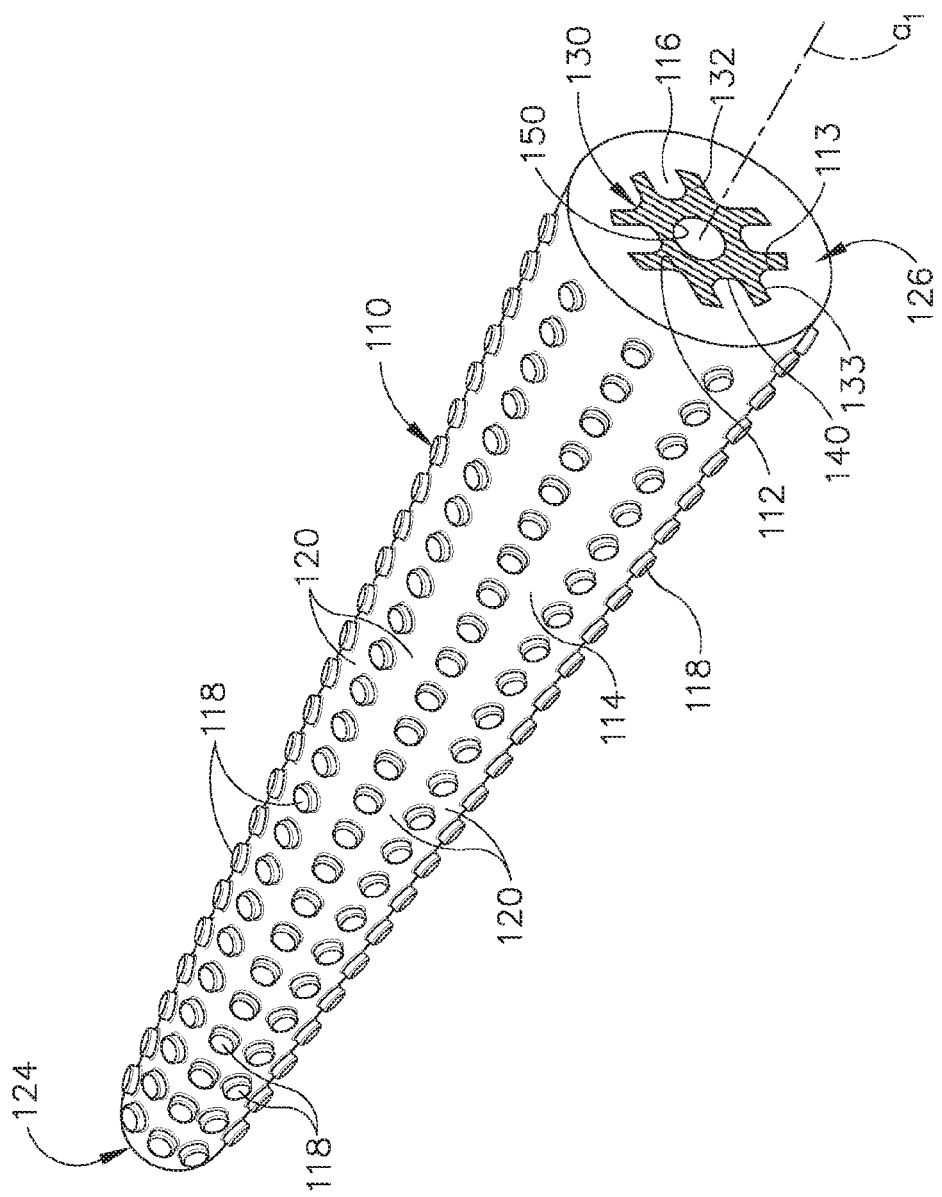
FIG. 2 depicts a perspective view of a frusto-conical brush, in accordance with one embodiment of the present invention.
Figure 3:
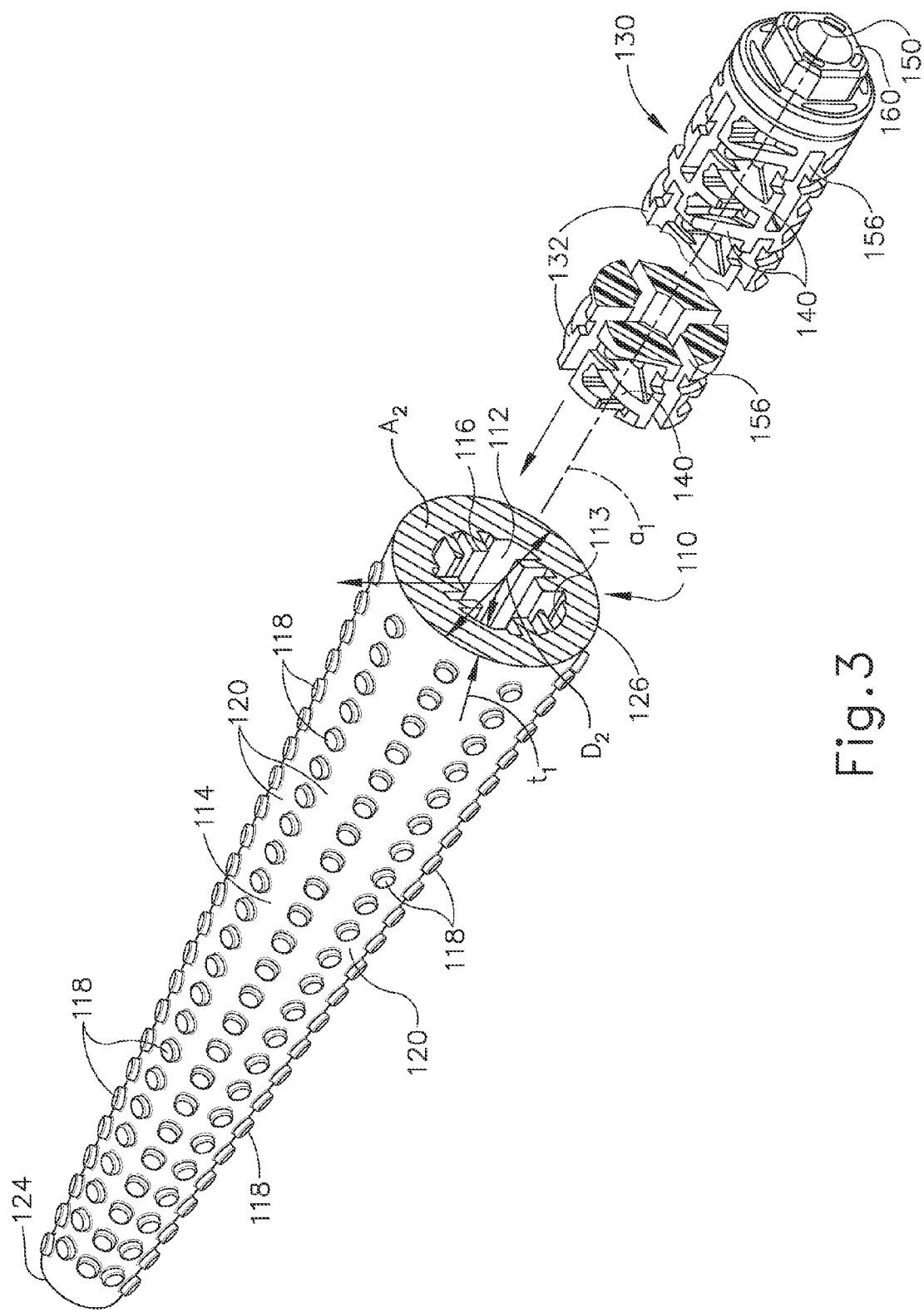
FIG. 3 depicts a partially exploded perspective view of a frusto-conical brush and a portion of a brush core broken for purposes of illustrating principles of the disclosure, in accordance with one embodiment of the present invention.

With reference to FIGS. 1-3, the conically-shaped brush 110 includes an outer cleaning surface 114 opposed to an inner surface 113, forming the hollow bore 112. The hollow bore 112 may be formed around the brush core 130 by injection molding the brush 110 around an already formed brush core 130 or the hollow bore 112 may be formed and then later placed around the brush core 130. The hollow bore 112 is defined by the inner surface 113 of the conically-shaped brush 110. In one embodiment, the inner surface 113 is interrupted by a second engagement member 116 which mates with and surrounds a first engagement member 140 of the brush core 130. By forming the second engagement member 116 around the first engagement member 140, the brush 110 is securely fitted to the brush core 130 in order to prevent slippage and movement between the brush core 130 and the brush 110.

Figure 6:
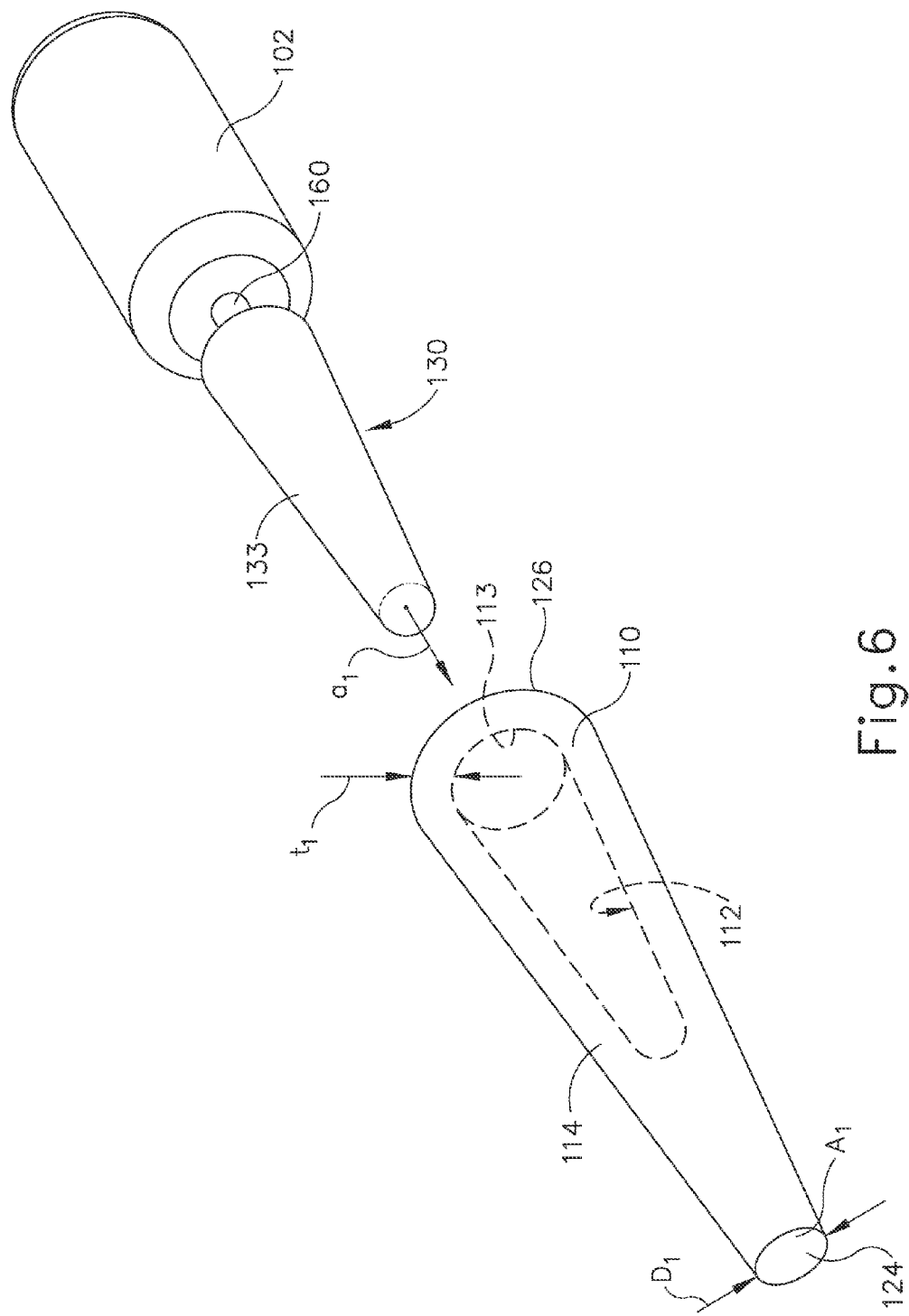
FIG. 6 depicts an exploded perspective view of a frusto-conical brush and brush core, in accordance with one embodiment of the present invention.

Outer cleaning surface 114 may be generally smooth, as shown in FIG. 6, or outer cleaning surface 114 may have surface features such as nodules 118 with channels 120 formed between the nodules 118, as shown in FIGS. 1-3. Having surface features such as nodules 118 with channels 120 may help brush 110 to better clean certain substrates 104. Surface features on the outer cleaning surface 114, such as cavities, channels 120, lines, edges, points, or other raised surfaces or nodules 118, may be incorporated and have a beneficial effect at increasing torque transmission levels but may be limited due to their effect on outer cleaning surface 114 geometry changes. Due to the frusto-conical configuration of the brush 110, the density of nodules 118 increases when moving along the surface 114 in a direction toward the second end 124. It should be understood that the illustrated configuration of nodules is an exemplary configuration and the brush 110 is capable of including a variety of different configurations of nodules, and all of such possible nodule configurations are intended to be within the spirit and scope of the present disclosure. For example, the nodules can have different sizes than that illustrated, the brush can include multiples sizes of nodules on the outer surface simultaneously, the nodules can have a variety of shapes, etc.

Figure 4:
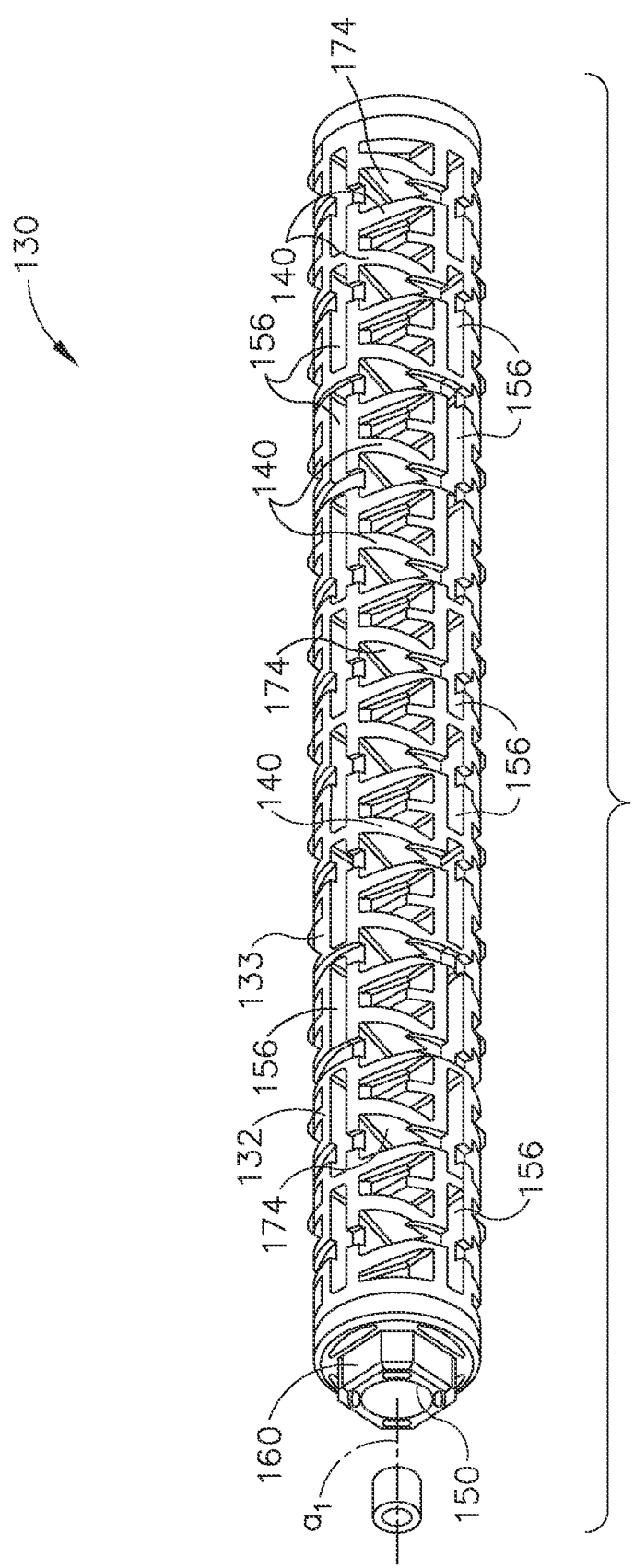
FIG. 4 depicts a perspective view of a brush core, in accordance with one embodiment of the present invention.
Figure 5:
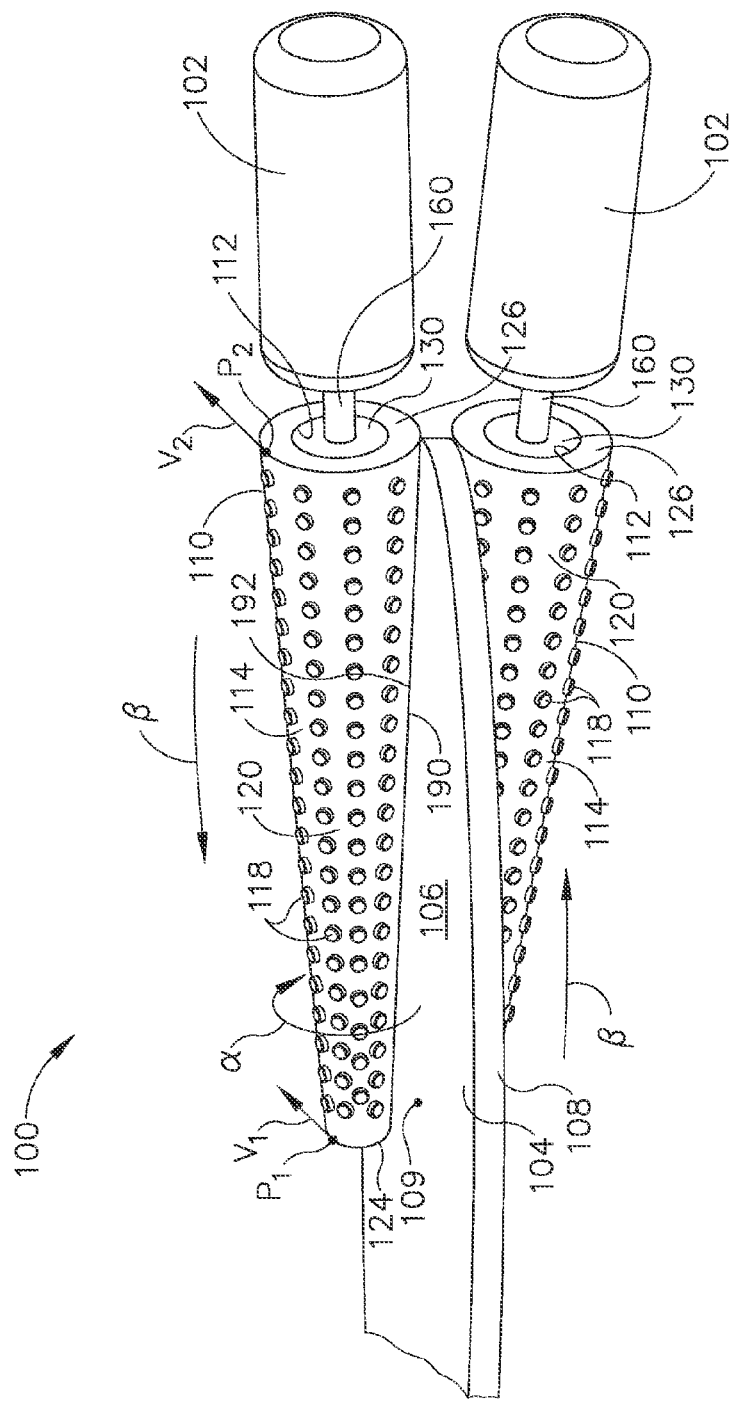
FIG. 5 depicts a perspective view of a cleaning system for cleaning and/or polishing substrates, in accordance with one embodiment of the present invention.

With reference to FIGS. 3 and 4, the brush core 130 engages the brush 110 within the hollow bore 112. The brush core 130 includes a body section 132 which forms an outer surface 133 which engages and is secured to the inner surface 113 defining the hollow bore 112 of the brush 110. With reference to FIG. 6, in one embodiment, the brush core 130 is generally conically-shaped, or generally frusto-conically shaped. In another embodiment, with respect to FIGS. 3 and 4, the brush core 130 is generally cylindrically shaped.

With reference to FIGS. 3 and 4, outer surfaces 114 and 133 may be positioned about a central axis $a_1$ of the brush core 130, or the outer surfaces 114 and 133 may be positioned symmetrically about the central axis $a_1$ of the brush core 130. In order to prevent rotational movement, and axial movement, between the brush 110 and the brush core 130, the profile or contour of the outer surface 133 may be interrupted by a first engagement member 140. Rotational movement is defined herein as movement along a rotational direction α about the central axis $a_1$, as shown in FIG. 1. Axial movement is defined herein as movement along an axial direction which is generally perpendicular to, within about ±30° of, the central axis $a_1$. First engagement member 140 is any feature which interrupts the general contour of outer surface 133 in order to better engage the second engagement member 116 of the brush 110. First engagement member 140 includes such features as a band or a series of bands, a ridge or series of ridges, or a channel 174 or a series of channels 174 at any number of locations along the outer surface 133 to effectively axially secure the brush 110 to the brush core 130, as shown in FIGS. 3 and 4.

As a result of first and second engagement members 140, 116, the physical fit between the outer surface 133 of the brush core 130 and the inner surface 113 of the brush 110 provides significant resistance to slipping. This resistance to slipping could be further enhanced by other methods including adhesives, surface preparation of the core (chemical, physical, corona, and the like), or such additional surface features as knurls, sharp edges, hooks, points, keys, or other linking features.

With reference to FIGS. 2 and 3, the generally conically-shaped brush 110 has the outer cleaning surface 114 and the hollow bore 112 positioned about a central axis $a_1$. The conically-shaped brush 110 has a first end 124 opposed to a second end 126. The first end 124 defines a first cross-sectional area $A_1$, as illustrated in FIG. 6, and the second end 126 defines a second cross sectional area $A_2$, as illustrated in FIG. 3. Both the first and second cross-sectional areas $A_1$ and $A_2$ are generally perpendicular to the central axis $a_1$. The first cross-sectional area $A_1$ is smaller than the second cross-sectional area $A_2$, allowing brush 110 to take on a generally conical shape. The cross-sectional area of the brush 110 when taken perpendicular to the central axis $a_1$ is generally increasing from the first end 124 to the second end 126.

By having a generally conical shape, when the brush 110 is rotated about the central axis $a_1$, a linear velocity $V_1$ of a first point $P_1$ on the outer cleaning surface 114 and near the first end 124 is less than a linear velocity $V_2$ of a second point $P_2$ on the outer cleaning surface 114 and near the second end 126. The linear velocities $V_1$ and $V_2$ are the velocities that points $P_1$ and $P_2$ travel at and which are generally tangential to the rotational direction α of the brush 110. As a result of the generally conical shape, points formed linearly along the outer cleaning surface 114 from the first end 124 of the brush 110 to the second end 126 of the brush 110, such as points $P_1$ and $P_2$, each travel at a linear velocity which is tangential to the rotational direction α and which is generally increasing from the first end 124 of the brush 110 to the second end 126 of the brush 110. Put another way, the linear velocity of points formed linearly along the outer cleaning surface 114 is not constant, but rather increasing or decreasing.

The first cross sectional area $A_1$ forms a generally-circular shape, or a generally donut-shape, having a first average outer diameter $D_1$, and the second cross sectional area $A_2$ forms a generally-circular shape, or a generally hollow donut-ring-shape, having a second average outer diameter $D_2$ which is greater than the first average diameter $D_1$. The second average diameter $D_2$ is greater than the first average outer diameter $D_1$ by about 50% to about 500%.

With reference to FIG. 6, in one embodiment, the brush 110 forms a generally conically-shaped or frusto-conically shaped hollow bore 112, in order to accept a generally conically-shaped or frusto-conically shaped brush core 130 and to allow for a generally conically-shaped or frusto-conically shaped brush 110 having generally constant thickness $t_1$. The brush 110 is adapted to include a variety of different types, shapes and configurations of cores and the illustrated cores are only examples of the many possible cores and are not intended to be limiting upon the present disclosure.

With reference to FIG. 4, pores 156 are formed from the outer surface 133 of the body section 132 to a fluid channel 150 in the body section 132 for flowing polishing fluid from the fluid channel 150 to the outer surface 133 of the body section 132 and to the brush 110.

With reference to FIG. 4, in one embodiment, the brush core 130 also includes a rotational engagement member 160 for engaging and connecting with a rotational device 102. The rotational engagement member 160 is any device which can be used to connect with or fasten to another device, and includes things such as, for example, a nut-shaped piece or other polygonal shaped piece that is unitarily formed as one-piece with the brush core 130 and can be fastened to the rotational device 102. The rotational device 102 includes any device which can induce a rotational movement onto the brush core 130, such as an electrical motor, a gas motor or engine, a crank shaft power by a motor or manually powered, and any combination of pulleys, wheels, mechanical linkages, and/or gears moved automatically or manually. The rotational device 102 has a complimentary engagement member which connects with the rotational engagement member 160 for engaging and connecting the brush core 130 with the rotational device 102.

In operation, the brush 110 may be placed or formed around the brush core 130 by injection molding the brush 110 around the brush core 130. Upon placing or forming the brush 110 around the brush core 130, the brush core 130 and the brush 110 are then connected with the rotational device 102 by connecting the rotational engagement member 160 with an engagement member on the rotational device 102. Then, the brush 110 is rotated in the rotational direction α about the central axis $a_1$. While rotating the brush 110, or before rotating the brush 110, the brush 110 is placed near and engages the surface 106 of the substrate 104. In the illustrated exemplary embodiment, the cleaning device requires support only at one end thereof (the rotational device 102 end) and contacts only a portion of the substrate 104 across its diameter. Conventional cleaning devices contact a substrate completely across their diameter and require support at both ends of the cleaning device. In some embodiments of the present disclosure, the cleaning device contacts less than the entire diameter of the substrate (i.e., less than 100 percent of the diameter). In other embodiments of the present disclosure, the cleaning device contacts less than about 70 percent of the diameter of the substrate. In further embodiments of the present disclosure, the cleaning device contacts less than about 60 percent of the diameter of the substrate. In still other embodiments of the present disclosure, the cleaning device contacts about 50 percent of the diameter of the substrate.

Figure 7:
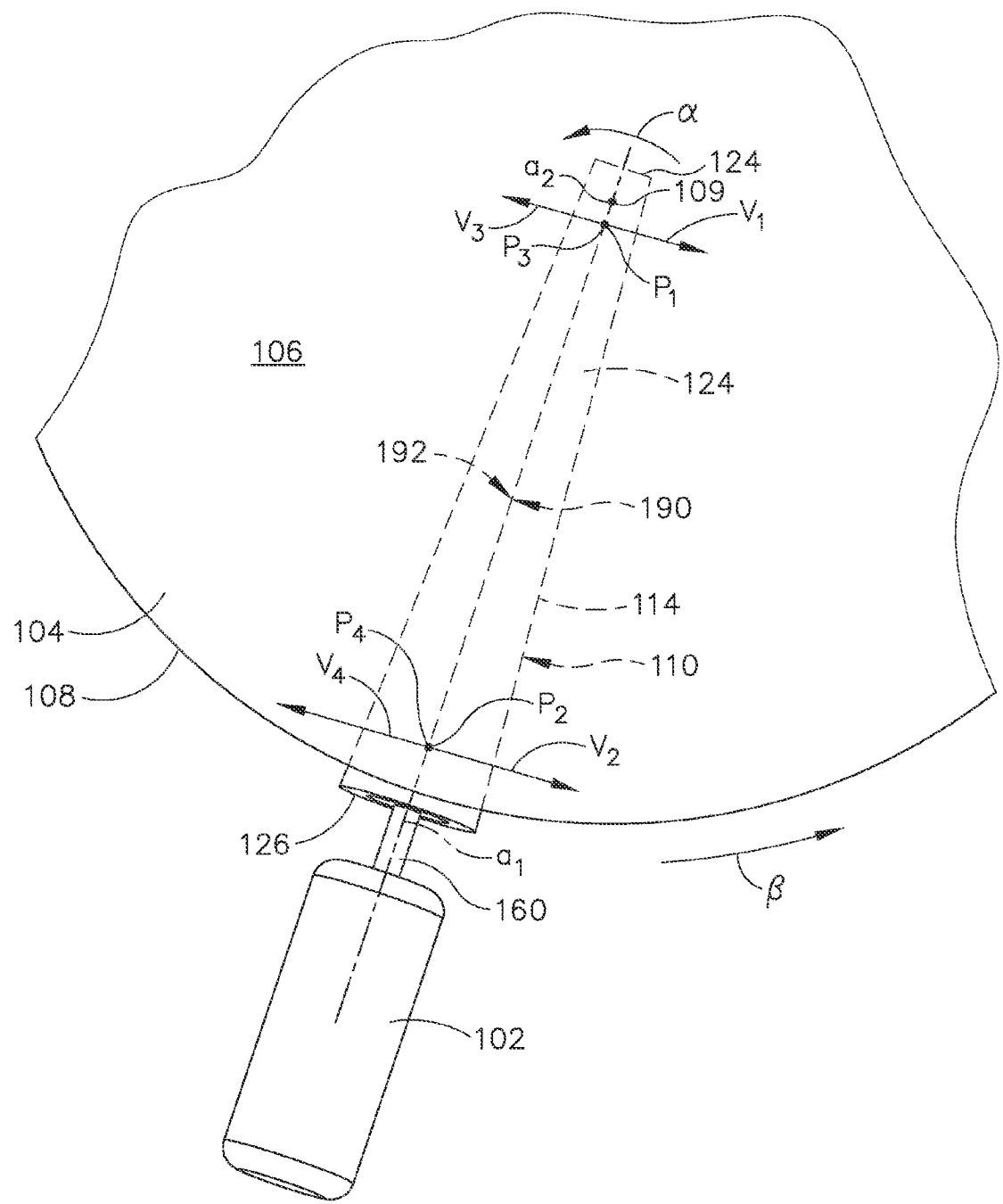
FIG. 7 depicts a top view of a cleaning system for cleaning and/or polishing substrates, in accordance with one embodiment of the present invention.

With reference to FIG. 1, the brush 110 engages the substrate 104 with the brush core 130 positioned about a first central axis $a_1$. The cross-sectional area of the brush 110 when taken perpendicular to the first central axis $a_1$ of the brush core 130 is generally increasing from the first end 124 to the second end 126. Upon engaging the brush 110 with the substrate 104, the brush is then rotated about the first central axis $a_1$ in a first rotational direction α and the substrate 104 is rotated about a second central axis $a_2$ in a second rotational direction β. With reference to FIG. 7, the first central axis $a_1$ is radially aligned with and intersects the second central axis $a_2$ (extending directly out of the page in FIG. 7).

With continued reference to FIG. 7, points, such as $P_1$ and $P_2$, formed linearly along the outer cleaning surface 114 from the first end 124 of the brush 110 to the second end 126 of the brush 110 each travel at their respective first linear velocities $V_1$ and $V_2$, which are tangential to the first rotational direction α and which are generally increasing from the first end 124 of the brush 110 to the second end 126 of the brush 110, as illustrated by the differences in the lengths of each arrow for $V_1$ and $V_2$.

Points, such as $P_3$ and $P_4$, formed radially along the substrate 104 from an outer edge 108 of the substrate 104 to a center 109 of the substrate 104 each travel at their respective second linear velocities $V_3$ and $V_4$, which are tangential to a second rotational direction β and which are generally decreasing from the outer edge 108 of the substrate 104 to the center 109 of the substrate 104, as illustrated by the differences in the lengths of each arrow for $V_3$ and $V_4$.

The rotational motion of the brush 110 on the surface 106 helps to clean and/or polish the surface 106. With reference to FIG. 1, in one embodiment, the substrate 104 is also rotated along a rotational direction β about a second central axis $a_2$ formed through the center 109 of the substrate 104. In one embodiment, polishing fluid is pumped through fluid channel 150 formed in the body section 132 and into the brush 110 through pores 156 formed through the outer surface 133 of the body section 132 and to the fluid channel 150. The polishing fluid helps to further clean and/or polish the substrate 104.

A difference $d_v$ between the first linear velocity of any point along the outer cleaning surface 114, such as $P_1$, and the second linear velocity of a point formed radially along the substrate 104 and adjacent the first point, such as $P_3$, is generally constant to within about ±10%, or within about ±5%. A difference $d_v$ between a first linear velocity of any first point on a first engagement surface 190 of the brush 110, such as $P_1$, and a second linear velocity of a second point on a second engagement surface 192 of the substrate 104 (surfaces 190 and 192 are collinear in FIG. 7) and adjacent the first point, such as $P_3$, is generally constant to within about ±10% or to within about ±5%. The first engagement surface 190 of the brush 110 is the portion of the brush 110 which makes contact with the substrate 104 at a given point in time when the brush 110 engages the substrate 104. The second engagement surface 192 of the substrate 104 is the portion of the substrate 104 which makes contact with the brush 110 at a given point in time when the brush 110 engages the substrate 104.

By providing for a generally constant difference $d_v$ between the first and second linear velocities of points on the brush 110 and the substrate 104, slippage between the brush 110 and the substrate 104 may be reduced when the brush 110 engages and cleans the substrate 104.

It should be understood that the brushes disclosed herein are adapted to clean and/or polish any size and shape of substrate. Moreover, the brushes may have various configurations to accommodate substrates of different sizes and shapes and all of such configurations are intended to be within the spirit and scope of the present disclosure. For example, the brush may have a greater or lesser rate of decreasing diameter along the length of the brush to accommodate different substrates or different rotational speeds of substrates.

Although the illustrative examples above describe PVA brushes 110 used to clean semiconductor substrates 104, one having skill in the art will appreciate that methods and systems consistent with the present invention are not limited thereto. For example, the brush 110 may include other materials and may be used to clean other types of surfaces 106 or substrates 104. Further, the brush 110 may or may not have nodules or cavities formed on or in the outer cleaning surface 114 of the brush 110. In such an exemplary brush, the outer surface of the brush will be relatively smooth.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While various embodiments of the invention have been described, it will be apparent to those of ordinary skill in the art that other embodiments and implementations are possible within the scope of the invention. Accordingly, the invention is not to be restricted except in light of the attached claims and their equivalents.

The invention claimed is:

1. A method for cleaning a substrate, the method comprising:
   engaging a substrate with a cleaning device including a brush core positioned about a first axis and a brush including an outer surface and a hollow bore defined in the brush around the brush core, the brush also includes a first end opposed to a second end, and wherein a cross-sectional area of the brush when taken perpendicular to the first axis increases from the first end to the second end;
   rotating the brush about the first axis in a first rotational direction;
   rotating the substrate about a second axis in a second rotational direction;
   wherein the second axis intersects the first axis, and wherein points formed linearly along the outer surface from the first end of the brush to the second end of the brush each travel at a respective first linear velocity, wherein the first linear velocities are tangential to the first rotational direction and are increasing from the first end of the brush to the second end of the brush;
   and wherein points formed radially along the substrate from an outer edge of the substrate to a center of the substrate each travel at a respective second linear velocity, wherein the second linear velocities are tangential to the second rotational direction and are decreasing from the outer edge of the substrate to the center of the substrate.

2. The method of claim 1, wherein the substrate is a circular semiconductor wafer.

3. The method of claim 1, wherein the substrate is a circular substrate.

4. The method of claim 1, wherein a difference between the first linear velocity of a first point along the outer surface of the brush and the second linear velocity of a second point formed radially along the substrate and adjacent the first point is constant to within about ±10%.

5. The method of claim 1, wherein the brush is a polyvinyl alcohol brush.

6. The method of claim 1, wherein a plurality of nodules are on the outer surface of the brush.

7. A method for cleaning a substrate, the method comprising:
   rotating a cleaning device about a first axis, wherein the cleaning device includes a first end, a second end opposed to the first end, a brush core positioned about the first axis, and a brush formed around the brush core, and wherein a cross-sectional area of the brush when taken perpendicular to the first axis increases from the first end to the second end;
   rotating a substrate about a second axis; and
   engaging a first surface of the cleaning device with a second surface of the substrate, wherein a difference between a first linear velocity of a first point on the first surface and a second linear velocity of a second point on the second surface and adjacent the first point is constant to within about ±10%.

8. The method of claim 7, wherein the substrate is a circular semiconductor wafer.

9. The method of claim 7, wherein the substrate is a circular substrate.

10. The method of claim 7, wherein the second axis is radially aligned with and intersects the first axis.

11. The method of claim 7, wherein the difference between the first linear velocity and the second linear velocity is constant to within about ±5%.

12. The method of claim 7, wherein the brush is a polyvinyl alcohol brush.

13. The method of claim 7, wherein the brush includes a plurality of nodules on an outer surface of the brush.

* * * * *